July 31, 1962 G. F. FRANK 3,047,745

SEMICONDUCTOR TIME DELAY CIRCUITS UTILIZING THE SWITCHING CHARACTERISTICS OF UNIJUNCTION TRANSISTORS

Filed Dec. 15, 1959

INVENTOR:
GERALD F. FRANK,
BY William D Roberson
ATTORNEY.

United States Patent Office 3,047,745

Patented July 31, 1962

3,047,745
SEMICONDUCTOR TIME DELAY CIRCUITS UTILIZING THE SWITCHING CHARACTERISTICS OF UNIJUNCTION TRANSISTORS

Gerald F. Frank, Bloomington, Ill., assignor to General Electric Company, a corporation of New York Filed Dec. 15, 1959, Ser. No. 859,813
6 Claims. (Cl. 307—88.5)

This invention relates to time delay circuits and more particularly to time delay circuits making use of semiconductor switching elements.

The unijunction transistor, because of its highly stable negative resistance characteristics, is often applied in electrical timing circuits for introducing a delay between the initiation of a signal and the response to it. Heretofore, however, the length of time delay which has been possible in such timing circuits has not been long, primarily because of the limitations on the values of passive electrical components which may be employed in these circuits.

It is a general object of this invention to provide a novel timing circuit employing a unijunction transistor whose range of time delay periods may be considerably lengthened.

It is a further object of this invention to provide a novel unijunction transistor time delay circuit employing, for the purposes of achieving greatly lengthened time delay periods, circuit components having values not heretofore usable in circuits of this general nature.

A more specific object of the invention is to provide a time delay circuit employing a unijunction transistor in combination with an RC network and in which the resistance value of the network may be greatly increased to increase the time delay period.

By way of a brief summary of but one embodiment of the present invention, I employ a unijunction transistor whose base electrodes are connected across a power supply and whose emitter electrode is connected in an RC network to acquire a peak firing potential when the capacitor in the RC network is sufficiently charged. For longer periods of time delay very high values of resistance are employed in the RC network, so high that the resistance would ordinarily prevent sufficient currents from flowing through the emitter to carry the transistor over into the negative resistance portion of its electrical characteristic. However, the characteristic of the unijunction transistor is periodically altered by the application of a brief voltage pulse applied to lower the interbase potential, thereby permitting the capacitor in the RC circuit to supply the additional peak point current required to switch the capacitor into its lower resistance condition at the end of a predetermined time delay period.

Further details of the invention as well as additional objects and advantages will be more readily perceived with reference to the following more complete description taken in connection with the accompanying drawings, wherein.

Figure 1:
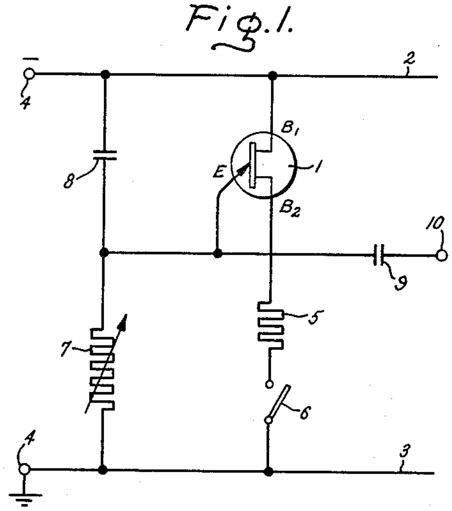
FIG. 1 is a schematic diagram of a simplified unijunction transistor time delay circuit to aid in explaining the principles of this invention.

FIG. 1 shows one form of time delay circuit employing a unijunction transistor 1, or a double base diode as it is sometimes called. The two base electrodes B1 and B2 of this transistor are connected across a source of D.C. power represented by power leads 2 and 3 with terminal connections 4, through load resistance 5 and a switch 6. The control potential for the emitter E of the unijunction transistor is supplied from an RC network including a resistor 7 and a capacitor 8 also connected across the power supply to charge the capacitor 8 through the resistor 7, the emitter electrode being connected to the junction between the resistor and the capacitor. Thus, the potential applied from the emitter to base-one is derived from the instantaneous potential on the capacitor 8. With switch 6 open, the interbase potential across the unijunction transistor is substantially zero and the resistance of the transistor from emitter to base-one is quite low. Since the capacitor 8 is shunted by a low resistance connection, then, it is prevented from acquiring a substantial charge.

Figure 2:
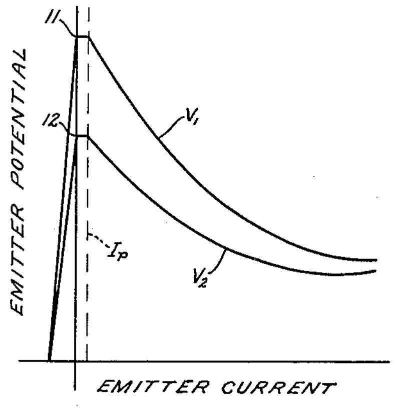
FIG. 2 is a graphical representation of some electrical characteristics of a unijunction transistor.

Closing switch 6 starts a delay period by creating a different set of conditions in the circuit. First, the interbase potential becomes approximately that of the applied source of power represented by conductors 2 and 3 and their terminal connections. This changes the electrical characteristics of the unijunction transistor, rendering the emitter resistance high. In FIG. 2 are shown characteristic curves for a single unijunction transistor corresponding to two different interbase potentials, V1 and V2, V1 being the higher potential. Here the vertical axis represents the emitter potential, referred to base-one as it usually is, and the horizontal axis represents the emitter current. It will be noted that there exists on each of these curves a peak 11 and 12 respectively to the left of which the characteristic exhibits a positive slope, while to its right there exists a negative slope for an extended range of current. For each selected interbase potential, the emitter potential must reach this peak potential and a minimum peak point emitter current, $I_p$, must flow before the device can fire and operate in the negative resistance portion of its characteristic.

When switch 6 is closed, the emitter resistance of the unijunction transistor changes from a low value to a high value and the capacitor 8 then begins to be charged through resistance 7 from the source. As the potential on capacitor 8 increases, the emitter potential approaches the peak point. The time required for it to reach the peak point is, as must be apparent by now, the delay period of the circuit, and depends upon the time constant of the RC network. To adjust the delay period the value of the resistor 7 may be varied and for this purpose the resistor is shown as an adjustable one. When the peak firing potential is reached and the peak point current flows through resistor 7 into the emitter, the emitter resistance immediately becomes very low causing the discharge of capacitor 8 through the emitter. The discharge of this capacitor is reflected as a sudden change of emitter potential, which may provide an output signal. For this purpose a capacitor 9 passes an output signal pulse to the output terminal 10. This output signal pulse signals the end of the time delay period and may be employed as a control signal in any known manner.

In practice, the ranget of delay periods provided by a circuit of the nature shown in FIG. 1 is limited by certain circuit parameters, particularly the values of capacitor 8 and of resistor 7 which may be employed. For reasons to be explained the resistor 7 is generally limited to values no higher than about 300K and the capacitor 8 must be quite high in capacitance to obtain time delays of substantial length. For example, to obtain thirty seconds of time delay a capacitor of approximately 100 microfarads must be used. A capacitor of this size might be of an electrolytic type, except that these are unreliable and unstable with time and with changing ambient temperature. A tantalum capacitor will operate very satisfactorily but is quite expensive. Desirably the timing capacitor should be of a paper or Mylar type and preferably in the smaller sizes. However, this requires a charging resistor having values in the megohm range to obtain time delays of thirty seconds or more.

A reinspection of FIG. 2 should help to illustrate why values of resistor 7 are usually limited below the megohm range. For if resistor 7 is sufficiently high in resistance it will not pass the required peak current $I_p$ to trigger the unijunction transistor into the negative resistance portion of its characteristic.

Figure 3:
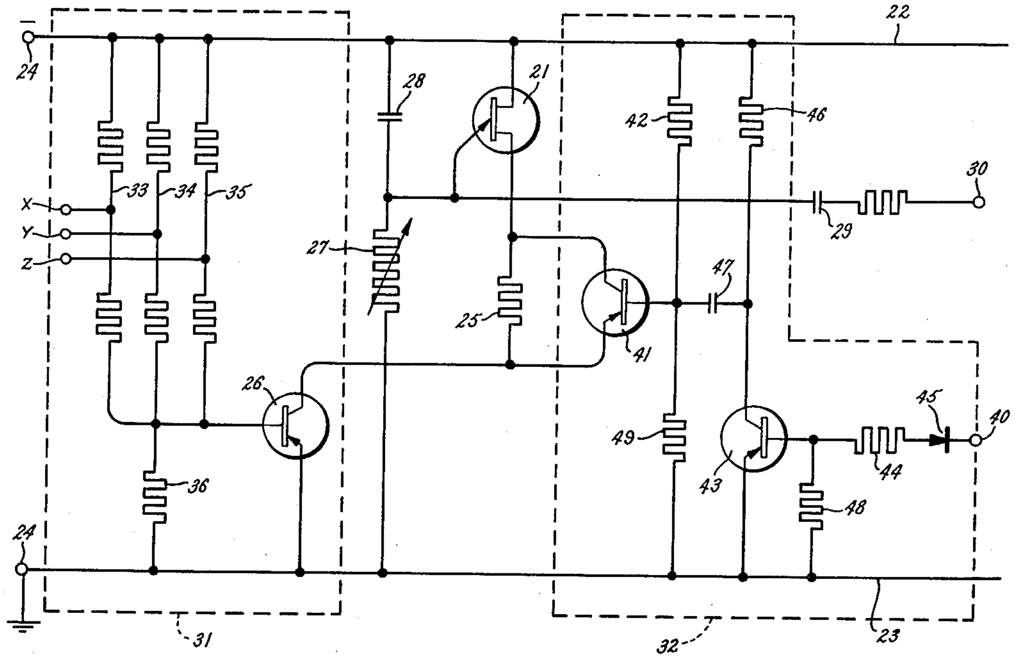
FIG. 3 is a circuit diagram of a preferred form of time delay circuit constructed in accordance with this invention.

This limitation, however, may be successfully overcome and charging resistors as high as twenty megohms may be used to provide time delays of the order of a minute by periodically and momentarily reducing the interbase potential across the unijunction transistor. For when the interbase potential is lowered momentarily while the capacitor is charged at or about its peak potential, then the capacitor itself can supply the required peak firing current. In this way the resistor 7 must supply only the charging current for capacitor 8, but not the firing current for the unijunction transistor. Accordingly, the resistor 7 may be large in value and the capacitor 8 correspondingly small for a given time delay period. One way, a preferred way, in which this has been accomplished is shown in FIG. 3.

In this figure, which is intended to illustrate among other things the application of this invention in a static logic system, certain basic elements of this system common or analogous to those in the circuit of FIG. 1 are numbered similarly, but with reference numerals higher by twenty than in FIG. 1. Thus the unijunction transistor 21 is connected across supply lines 22 and 23 to which a D.C. potential is supplied through terminals 24. Load resistor 25 is connected in series with the unijunction transistor to provide a current limiting and voltage dropping function, while resistor 27 and capacitor 28 function as before to govern the delay period. The output signal is also coupled through capacitor 29 to the output terminal 30. The initiation of the delay period is governed by the Not-And logic unit 31 whose PNP transistor 26 serves the function of the switch in FIG. 1, while the pulse power supply 32 supplies the brief intermittent voltage pulses to lower the interbase potential of the unijunction transistor intermittently.

The logic unit 31 is not the subject matter of this invention but is described more fully and claimed in a copending application, Serial No. 810,116, filed April 30, 1959, in the name of Paul J. de Fries. It is included here primarily to illustrate a preferred manner of use of the present invention. This logic circuit employs a single transistor 26 connected in series with a load, which in this case includes resistor 25 and unijunction transistor 21, across the source. The logic unit 31 has three input circuits 33, 34 and 35 associated with it. These three input circuits are in the form of identical voltage dividers and each is connected in series with a compensating resistor 36 in the base circuit of the transistor 26. The voltage balance across the voltage dividers and the base resistor in the absence of signals applied to input terminals X, Y, and Z is such that sufficient current flows in the base circuit to render the transistor conducting, that is, it is like a closed switch. The circuit impedances are selected such that the biasing current through the base of transistor 26 is interrupted only when an input signal is supplied at all three input terminals. As a result, the transistor 26 has a low impedance when no input signal is present and when there are some input signals present at the input terminals, but not when all input signals are present.

For purposes of the present discussion it may be assumed that input signals are normally present at each of the terminals X, Y, and Z, and that transistor 26 is therefore normally non-conductive. In this condition the unijunction transistor 21 has a very low interbase potential across it and the potential on capacitor 28 is correspondingly low. Interruption of any one or all of the input signals at terminals X, Y, or Z will render transistor 26 conductive and begin the timing cycle by initiating the charging of capacitor 28. If it be assumed that the resistance of resistor 27 is very high, of the order of megohms, the charging current which is permitted to flow through it will be very low. For illustrative purposes the characteristic of the unijunction transistor 21 at the applied interbase potential can be considered to be represented by curve V1 of FIG. 2. In a preferred example the interbase potential supplied to the unijunction transistor 21 by the power supply is 12 volts; hence, the current which can flow through resistor 27 when it is adjusted to a value of about 5 megohms is little more than two microamperes. While this low current is appropriate to a long time delay in the circuit, it is not sufficiently large to supply the peak point firing current $I_p$ to the emitter of the unijunction transistor. The potential on the capacitor 28 can therefore approach but not reach the peak point emitter voltage 11 for the applied interbase potential of 12 volts.

The pulse power supply 32 is intended to overcome this limitation on the use of the circuit by periodically altering the electrical characteristics of the unijunction transistor so that its characteristics resemble, for example, curve V2 of FIG. 2. The pulse power source has an input terminal 40 which may be energized conveniently from a commercial source of 60 cycle electrical power, and an output transistor 41 which delivers short periodic potential pulses in series with the unijunction transistor 21. I have preferred to employ pulses of about 1 volt in amplitude and 50 microseconds in duration which, at 60 cycles per second occur about 16 milliseconds apart.

The potential pulses which periodically reduce the interbase potential of transistor 21 are occasioned by the periodic increase of the resistance in series therewith. When transistor 26 is switched on to initiate a time delay period, transistor 41 is also switched on by reason of the bias current which is permitted through its base and through resistor 42. Since transistor 41 shunts the load resistor 25, therefore, the interbase potential across the unijunction transistor is substantially that of the source connected across terminals 24 minus the IR drops in transistors 41 and 26. Transistor 41 is periodically switched "off," that is, rendered substantially nonconducting, thereby effectively increasing the resistance in series with the unijunction transistor 21 and lowering its interbase potential. This is brought about by a signal derived from the alternating potential applied to input terminal 40. The normally nonconducting transistor 43 is cyclically triggered into conductance by the base current periodically permitted to flow from its base through current limiting resistor 44 and diode 45. This periodic conductance of transistor 43 alters the potential balance across resistor 46 in series therewith and couples a pulse through capacitor 47 to the base of transistor 41. This is the pulse which periodically switches off transistor 41 thereby pulsing the interbase potential across the unijunction transistor. Resistors 48 and 49 provide a conventional compensating function.

The potential pulses thus produced are of a polarity to reduce instead of increase the interbase potential periodically, thus reducing momentarily the peak potential required to trigger the unijunction transistor into its more highly conductive state. As the charge on capacitor 28 increases, the potential across the capacitor will eventually reach a value in excess of the peak point value 12 although not yet as high as the peak point voltage 11. After this has occurred the next succeeding potential pulse applied by the pulse generator 32, by lowering the peak point potential required to fire the unijunction transistor, will permit the capacitor 28 itself to supply the required peak point current to fire the unijunction transistor. Thus it can be seen that very high values of resistor 27 may be used to provide much lengthened time delay periods, that is values in excess of those which would permit the flow of peak point firing currents through the resistor. For by periodically reducing the interbase potential these peak point currents are supplied not by the timing resistor 27 but by the timing capacitor 28. It is therefore not necessary by a practice of this invention to resort to the much more expensive expedient of employing larger and larger capacitors to increase the time delay periods. When it is realized that a single pulse power supply can provide pulses for dozens and even for hundreds of individual unijunction transistor timing circuits, it may be appreciated that the savings realized are substantial indeed.

It is to be understood, of course, that the circuits specifically disclosed herein are offered by way of illustration of the principles of this invention, and that they should not be interpreted necessarily as limiting the application of these teachings. The disclosure has been simplified somewhat to bring into relief the invention itself and variations in the circuit will doubtless occur to those skilled in the art to which the invention pertains. For example, in the circuit branch which includes capacitor 28, a resistor might advantageously be added to limit the surge of current which flows when capacitor 28 discharges through emitter, thus protecting the unijunction transistor against excessive currents. Again, a temperature compensating resistor of an appropriate value might be inserted in parallel with the series connected combination of unijunction transistor 21 and resistor 25. These and other such variations in circuitry as fall within the true spirit and scope of the present invention are intended to be covered by the following claims.

What I claim as new and desire to secure by Letters Patent of the United States is:

1. In combination: a timing circuit including a resistor and a capacitor to be connected across a source of electric potential whereby said capacitor is charged from said source through said resistor; a unijunction transistor having an emitter electrode and a pair of base electrodes; means connecting said capacitor across said emitter electrode and one of said base electrodes to apply to said emitter electrode a potential derived from the capacitor potential; means including a switch for applying a predetermined interbase potential to said unijunction transistor to thereby increase the initial impedance of said emitter electrode and begin the charging period of said capacitor; the resistor in said timing circuit having a resistance value too great to supply sufficient emitter current to convert the emitter electrode to a low impedance condition; pulse generating means operable at preselected intervals during charging of said capacitor for periodically and momentarily reducing said interbase potential by a predetermined amount to permit the charge on said capacitor to support a peak point emitter current sufficient to convert the emitter electrode to a low impedance condition, thereby discharging said capacitor; and means responsive to the discharge of said capacitor to produce an output signal pulse.

2. In combination: a timing circuit including a first resistor and a capacitor to be connected across a source of electrical potential whereby said capacitor is charged from said source through said first resistor; a unijunction transistor having an emitter electrode and a pair of base electrodes; means connecting said capacitor across said emitter electrode and one of said base electrodes to apply to said emitter electrode a potential derived from the capacitor potential, said emitter-to-base connection across said capacitor having a low impedance for low interbase potentials; a second resistor and a switching device connected in series circuit with said base electrodes with said series circuit being adapted for connection across said source; said switching device being actuable to a closed position to thereby apply a predetermined interbase potential across said unijunction transistor, whereby the initial impedance of said emitter electrode is increased and said capacitor begins to charge; the resistor in said timing circuit having a resistance value too great to supply sufficient emitter current to convert the emitter electrode to a low impedance condition; means operable at preselected intervals during charging of said capacitor for periodically and momentarily reducing said interbase potential by a predetermined amount to permit the charge on said capacitor to support a peak point emitter current sufficient to convert the emitter electrode to a low impedance condition, thereby discharging said capacitor; and means responsive to the discharge of said capacitor to produce an output signal pulse.

3. In combination: a unijunction transistor including a semiconductor body of uniform conductivity type with spaced base electrodes adjoined thereto by ohmic contacts and an emitter electrode adjoined thereto by a rectifying junction intermediate said ohmic contacts; a timing circuit including a resistor and a capacitor connected in series to be connected across a source of direct current potential, a load resistor; said load resistor and said base electrodes being connected in a series circuit adapted for connection across said source; means connecting said emitter electrode to the circuit connection between said timing resistor and said timing capacitor such that the potential across said rectifying junction is derived from said capacitor potential; and means for applying during charging of said capacitor periodic potential pulses across said load resistor of a polartity to reduce momentarily the interbase potential across said unijunction transistor, thereby to permit the charge on said capacitor to support a peak point discharge current through said emitter junction.

4. In combination, a unijunction transistor having an emitter electrode and a pair of base electrodes, a timing circuit including a resistor and a capacitor connected in a series circuit adapted to be connected across a source of direct current potential, a load resistor, said load resistor and said base electrodes being connected in a series circuit adapted to be connected across said source, said emitter electrode being connected to the circuit connection between said resistor and said capacitor such that the emitter potential is derived from said capacitor potential, a shunt circuit shunting said load resistor, and means for periodically interrupting and establishing said shunt circuit during charging of said capacitor to periodically reduce the interbase potential of said transistor for permitting the charge on said capacitor to support a peak point discharge current through said emitter.

5. In combination, a unijunction transistor including a semiconductor body of uniform conductivity-type with spaced base electrodes adjoined thereto by ohmic contacts and an emitter electrode adjoined thereto by a rectifying junction intermediate said ohmic contacts, a timing circuit including a resistor and a capacitor connected in series to be connected across a source of direct current potential, a load resistor, said load resistor and said base electrodes being connected in a series circuit adapted to be connected across said source, said emitter electrode being connected to the circuit connection between said resistor and said capacitor such that the potential across said rectifying junction is derived from said capacitor potential, a shunt circuit including a transistor switch shunting said load resistor, and means for periodically opening and closing said transistor switch during charging of said capacitor to periodically reduce the interbase potential of said unijunction transistor for permitting the charge on said capacitor to support a peak point discharge current through said emitter junction.

6. A time delay circuit comprising; a unijunction transistor having an emitter electrode and two base electrodes, means including a switch for applying an electric potential across the base electrodes of said transistor to provide said transistor with a predetermined electrical characteristic, an RC timing circuit including a resistor and a capacitor connected in series relation to have applied thereacross an electric potential, said capacitor being connected between the emitter and one of the base electrodes of said transistor to be charged through said resistor from electric potential applied across the series connected resistor and capacitor, said resistor having a resistance value too great to supply sufficient emitter current to convert the emitter electrode of the transistor to a low impedance condition, and pulse generating means operable during charging of said capacitor for periodically and momentarily reducing the interbase potential of said transistor thereby to permit the charge on said capacitor to support a peak point discharge current through said emitter electrode.

References Cited in the file of this patent

UNITED STATES PATENTS 2,780,752 Aldrich et al. ------------ Feb. 5, 1957